United States Patent [19]

Busta et al.

[11] Patent Number: 4,685,996

[45] Date of Patent: Aug. 11, 1987

[54] METHOD OF MAKING MICROMACHINED REFRACTORY METAL FIELD EMITTERS

[76] Inventors: Heinz H. Busta, 223 N. Home, Park Ridge, Ill. 60068; Raul D. Cuellar, 6118 S. 31st St., Greenfield, Wis. 53221

[21] Appl. No.: 918,034

[22] Filed: Oct. 14, 1986

[51] Int. Cl.⁴ .................... H01L 21/306; B44C 1/22; B05D 5/12; C03C 15/00

[52] U.S. Cl. .................... 156/628; 156/647; 156/649; 156/651; 156/657; 156/659.1; 156/662; 357/55; 427/253; 437/225

[58] Field of Search ............ 156/626, 628, 647, 649, 156/651, 657, 659.1, 662; 148/1.5, 187; 29/571, 580; 357/55, 56, 65; 204/192 C, 192 EC; 427/88, 91, 256, 253

[56] References Cited

U.S. PATENT DOCUMENTS

| | | | |
|---|---|---|---|
| 3,746,587 | 7/1973 | Rosvold | 156/628 |
| 4,171,234 | 10/1979 | Nagata et al. | 156/647 |
| 4,371,803 | 2/1983 | Gigante | 156/628 |
| 4,396,459 | 8/1983 | Herning et al. | 156/647 |
| 4,428,111 | 1/1984 | Swartz | 156/649 |
| 4,614,119 | 9/1986 | Zavtacky et al. | 156/651 X |
| 4,618,397 | 10/1986 | Shimizu et al. | 156/628 |

Primary Examiner—William A. Powell

[57] ABSTRACT

A method of making a field emitter includes anisotropically etching a single crystal silicon substrate to form at least one funnel-shaped protrusion on the substrate, then conformally depositing a refractory metal onto the funnel-shaped protrusion. Alternatively, single crystal silicon may be anisotropically etched to form at least one funnel-shaped recess in the silicon. The etched surface is doped with an impurity to form an etch-stop layer, the remaining undoped silicon is removed, then the etch-stop layer is conformally deposited with a refractory metal. The funnel-shaped recess can then be back-filled with silicon or another suitable material.

19 Claims, 11 Drawing Figures

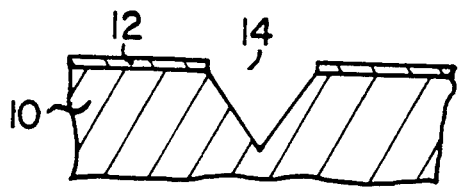
FIG.1A
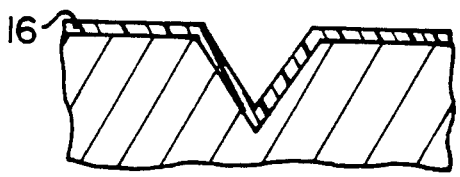
FIG.1B
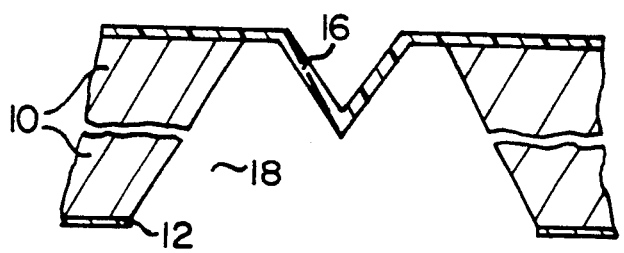
FIG.1C
FIG.1D
FIG. 1

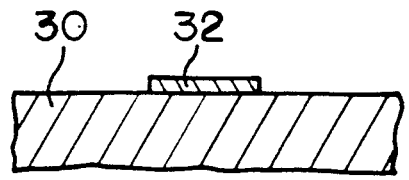
FIG. 2A
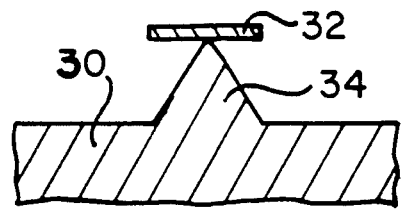
FIG. 2B
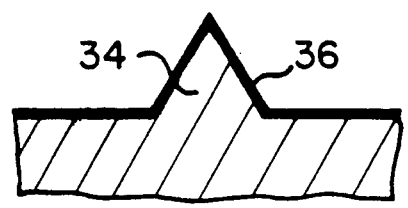
FIG. 2C
FIG. 2
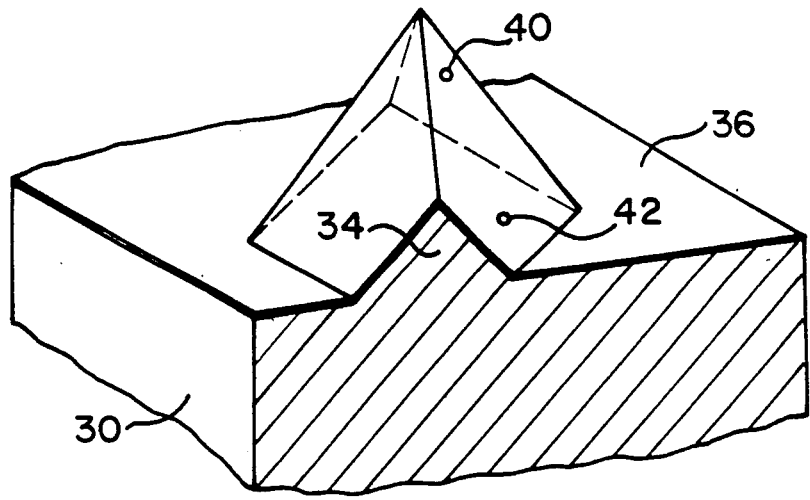
FIG. 3

METHOD OF MAKING MICROMACHINED REFRACTORY METAL FIELD EMITTERS

BACKGROUND OF THE INVENTION

This invention relates to a method of making field-emitter structures using semiconductor micromachining techniques.

Field-emitter structures are metallic structures with extremely small protruding points with radii ranging from approximately 20 A to 3000 A. Emission of electrons into a vacuum from a field-emitter occurs via quantum mechanical tunneling through the barrier whose width is determined by the enhanced local electric field at the tip. Field-emitters are useful in field ionizers, scanning tunnel microscopes, electron guns, and field emitter vacuum integrated circuits.

Field-emitters have been formed by depositing metal onto etched silicon which has been shaped into a pyramid or funnel shaped projection. U.S. Pat. No. 3,665,241 to Spindt describes such a field emitter. In Spindt the metal is evaporated onto a mold having holes formed by electron beam lithography. The shape of the field emitter is built-up by rotating the mold and by using multiple evaporation sources. Not only is Spindt's technique cumbersome, but also because of the varying distances from the evaporation sources, the field emitters produced do not have the same uniform structure. Furthermore, it is extremely difficult to coat silicon with a metal by sputtering or e-beam evaporation and to obtain good adhesion of the metal to the silicon near the tip of the emitter.

U.S. Pat. No. 4,307,507 to Gray, et al. overcomes some of the problems associated with mold rotation and deposition onto silicon. Gray's method etches emitter shaped cavities into a silicon substrate, back-fills them with a metal and then etches away the silicon leaving a solid metal emitter. Alternatively Gray provides that a passivation layer of silicon dioxide or silicon nitride is deposited on the etched silicon prior to filling with metal. While Gray's method offers advantages over Spindt's method, Gray's method produces only solid metal emitter structures and requires numerous processing steps.

Therefore, it is an object of the present invention to provide a method of making a field emitter structure requiring a minimum number of processing steps.

It is another object of the invention to provide a method of making a field emitter structure which will produce a solid metal emitter or a thin layer a metal on a solid silicon substrate emitter.

It is yet another object of the invention to provide a method of making a field emitter structure which is capable of good process control and reproducible results.

Additional objects, advantages, and novel features of the invention will be set forth in part in the description which follows, and in part will become apparent to those skilled in the art upon examination of the following or may be learned by practice of the invention.

SUMMARY OF THE INVENTION

To achieve the foregoing and other objects, and in accordance with the purposes of the invention, a method of making a field emitter structure may comprise the following steps: providing a substrate of single crystal silicon having a front surface and a back surface; etching the front surface to form at least one funnel-shaped recess in the substrate; diffusing an impurity into the etched substrate front surface to form an etch-stop layer; etching the back surface of the substrate to remove the single crystal silicon down to the etch-stop layer; and conformally depositing a refractory metal onto the etched back surface of the substrate. Alternatively, a method of making a field emitter structure may comprise the steps of: providing a substrate of single crystal silicon having a front surface and a back surface; etching the front surface of the substrate to form at least one funnel-shaped protrusion on the substrate; and conformally depositing a refractory metal on to the etched front surface of the substrate.

DESCRIPTION OF THE DRAWINGS

The invention is illustrated in the accompanying drawings wherein:

FIG. 1(A–D) shows a processing sequence for a field-emitter array which is formed having hollow pyramid emitters.

FIG. 2(A–C) shows a processing sequence for a field-emitter array having solid pyramid emitters.

FIG. 3 shows a schematic perspective view of a solid pyramid field emitter.

DETAILED DESCRIPTION OF THE INVENTION

Figure 4:
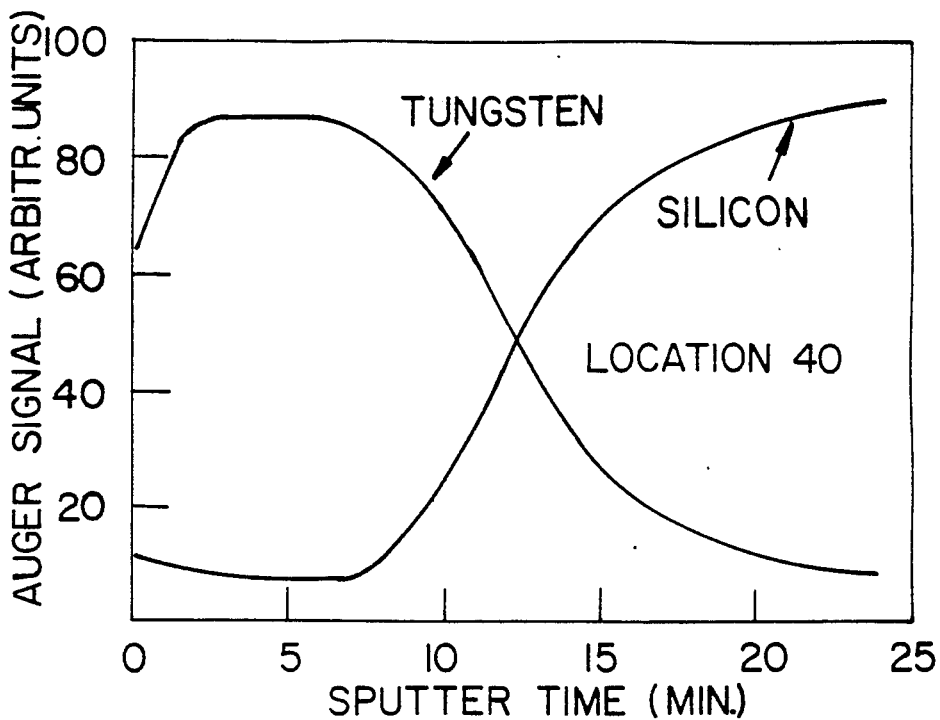
FIG. 4 shows an Auger elemental depth profile of the tungsten layer near the tip of a solid pyramid field emitter.

FIG. 1 shows a processing sequence for forming a field emitter in which the silicon pyramid is formed by etching a funnel-shaped recess into the substrate. The starting material is a three-inch diameter, (100), n-type or p-type silicon wafer 10. After initial cleaning, a 2000 A thick $SiO_2$ layer 12 is grown and 5 micron $\times$ 5 micron square openings 14 are photoshaped with one side of the square aligned parallel to the flat of the wafer which is oriented along the <110> direction. After etching in buffered hydrofluoric acid and photoresist removal, the wafer is anisotropically or orientation-dependent etched in an ethylenediamine-pyrocatechol-water (EPW) solution consisting of 660 ml ethylenediamine, 140 g pyrocatechol, 330 ml $H_2O$ at 100 degrees C. for approximately 15 minutes. Alternatively, KOH may be used as the orientation-dependent etchant. The resulting structure is shown in FIG. 1A. Anisotropic or orientation-dependent etching produces a recess in the silicon which is generally funnel or pyramid-shaped. This recess can also be described as having sides which intersect at a crystallographically sharp point.

The oxide layer 12 is then removed in buffered hydrofluoric acid from the front of the wafer. The back of the wafer is protected by a layer of photoresist during this operation. After photoresist stripping and cleaning, an impurity, p+, is then diffused into the front of the wafer at 1125 degrees C. for 20 minutes in an $N_2/O_2$ atmosphere using boron nitride discs to form layer 16. Layer 16, which is shown in FIG. 1B, acts as an etch stop for the subsequent EPW etching from the back of the wafer. To provide support for the 2–3 micron thick p+ layer on which the pyramids rest, only a small area 18 of the wafer is used for the EPW etch. The rest of the wafer is protected by the $SiO_2$ layer 12 (FIG. 1C). After rinsing in deionized water and nitrogen drying, the wafer is inserted into a solution consisting of 10 parts deionized water and 1 part of hydrofluoric acid for 30 seconds. In this step, the native oxide on the pyramids which can range from 20 to 40 A after EPW etching is reduced to 5-10 A. This is an acceptable thickness to assure reproducible, i.e. deposition of, consistent tungsten film thickness. Tungsten 20 is then conformally deposited in a low pressure chemical vapor deposition (LPCVD) reactor that allows WF$_6$ and argon to enter via mass flow meters. Deposition takes place at 400 degrees C., at a total system pressure of 0.3 Torr and a WF$_6$ flow rate of approximately 10 cc/min. Deposition time is 5 minutes. After tungsten deposition the final structure is shown in FIG. 1D. Any refractory metal such as tungsten or molybdenum that can be deposited on the substrate by the silicon reduction method can be used. The conformal deposition of tungsten technique is described in greater detail in U.S. Pat. No. 4,540,607 to Tsao. Deposition is accomplished according to the reaction 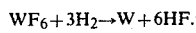, where M is a refractory metal such as tungsten or molybdenum. The advantage of this form of deposition over conventional evaporation or sputtering methods is that silicon is consumed during the reaction to form the metal film. This then yields conformal coverage at the tip of the pyramid with the metal, which is difficult to achieve reproducibly by other techniques.

The alternate method to form field emitters is shown in FIG. 2. The starting material is a three-inch diameter, (100), n-type or p-type silicon wafer 30. After initial cleaning, a 2000 A thick SiO$_2$ layer is grown and 5 micron×5 micron squares 32 are photoshaped (FIG. 2A) with their diagonals aligned parallel to the flat of the wafer which is oriented along the <110> direction. After etching in buffered hydrofluoric acid and photoresist removal, the wafer is orientation-dependent etched in an EPW solution at 100 degrees C. for approximately 15 minutes to form funnel-shaped protrusions or pyramids 34 which are bounded by four (111) planes (FIG. 2B). These planes intersect at a crystallographically sharp point. The wafer is then inserted into a solution consisting of 10 parts deionized water and 1 part of hydrofluoric acid to remove the SiO$_2$ layer 32 on top of the pyramids. This step is followed by the low pressure chemical vapor deposition of tungsten to form an approximately 200 A to 500 A thick conformal tungsten layer 36 on the pyramids and on the remaining silicon wafer. The deposition parameters are the same as in the previous method. FIG. 2C shows the final configuration.

FIG. 3 shows a schematic perspective view of a solid pyramid field emitter with a small cut-away section to reveal the conformal coverage of the entire structure with tungsten layer 36. The points marked as 40 and 42 on one face of the pyramid indicate the approximate locations at which the Auger elemental depth profiles shown in FIGS. 4 and 5 were taken.

Figure 5:
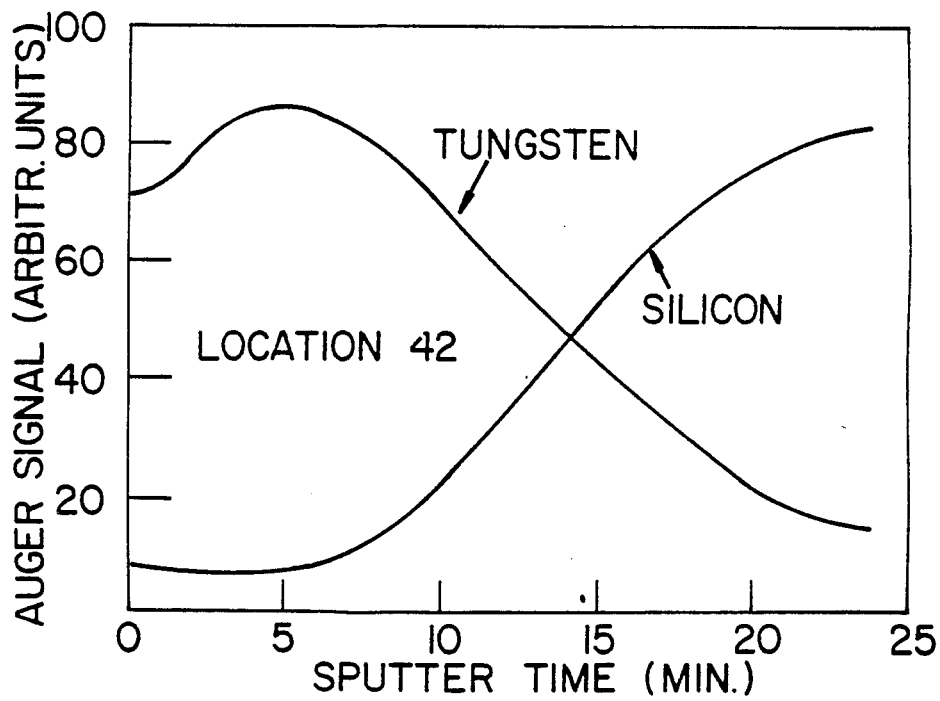
FIG. 5 shows an Auger elemental depth profile of the tungsten layer near the base of a solid pyramid field emitter.

FIGS. 4 and 5 show the Auger elemental depth profiles for tungsten and silicon of a solid pyramid field emitter. FIG. 4 was taken near the tip of the pyramid (indicated by 40 in FIG. 3) and FIG. 5 was taken near the base of the pyrmaid (indicated by 42 in FIG. 3). As can be seen, the 50% signals for tungsten and silicon lie near a sputtering time of 11 to 14 minutes which corresponds to a tungsten film thickness of approximately 200 A. This shows that uniform tungsten deposition takes place when using the silicon reduction method of WF$_6$ in a low pressure chemical vapor deposition apparatus. If a thicker tungsten film is desired, the silicon reduction method can be followed by the hydrogen reduction method according to the following reaction:

$$WF_6 + 3H_2 \rightarrow W + 6HF.$$

Several micrometer thick tungsten films can be deposited by this technique in a LPCVD reactor using approximately the same pressure and temperature ranges as in the silicon reduction method. The field emitters produced according to the method described with reference to FIG. 1 are hollow metal pyramids. To provide added structural rigidity, the hollow portion 22 may be back-filled with a suitable material: i.e. silicon or additional refractory metal. This can be accomplished by sputtering or e-beam evaporation.

We claim:

1. A method of making a field-emitter structure comprising the steps of:
   (a) providing a substrate of single crystal silicon having a front surface and a back surface;
   (b) etching the front surface of the substrate to form at least one funnel-shaped recess in the substrate;
   (c) diffusing an impurity into the etched substrate front surface to form an etch-stop layer;
   (d) etching the back surface of the substrate to remove the single crystal silicon down to the etch-stop layer; and
   (e) conformally depositing a refractory metal onto the etched back surface of the substrate.

2. The method of claim 1 wherein step (b) comprises the steps of:
   selectively masking the front surface of the substrate such that an unmasked area defines at least one island on the front surface;
   orientation-dependent etching the single crystal silicon under the unmasked area to form at least one funnel-shaped recess in the substrate; and
   removing the mask.

3. The method of claim 2 wherein said orientation-dependent etching is accomplished in a solution of ethylenediamine-pyrocatechol-water (EPW).

4. The method of claim 3 wherein said etch-stop layer is formed by boron-doping.

5. The method of claim 4 wherein said conformal deposition is accomplished by chemical-vapor deposition according to the reaction:

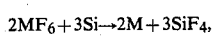

where M is selected from the group consisting of tungsten and molybdenum.

6. The method of claim 5 wherein said metal is tungsten.

7. The method of claim 5 wherein said metal is molybdenum.

8. The method of claim 3 wherein said solution is KOH.

9. The method of claim 1 further comprising the step of:
   (f) filling the funnel-shaped recess in the substrate with a material.

10. A method of making a field-emitter structure comprising the steps of:
    (a) providing a substrate of single crystal silicon having a front surface and a back surface;

(b) etching the front surface of the substrate to form at least one funnel-shaped protrusion on the substrate; and (c) conformally depositing a refractory metal onto the etched front surface of the substrate.

11. The method of claim 10 wherein step (b) comprises the steps of:

selectively masking the front surface of the substrate such that a masked area defines at least one island on the front surface of the substrate;

orientation-dependent etching the single crystal silicon under the masked area to form at least one funnel-shaped protrusion in the substrate; and removing the mask.

12. The method of claim 11 wherein said oxidation-dependent etching is accomplished in a solution of ethylenediamine-pyrocatechol-water (EPW).

13. The method of claim 12 wherein said mask is formed of silicon dioxide.

14. The method of claim 13 wherein said selective deposition is accomplished by chemical-vapor deposition according to the reaction $$2MF_6 + 3Si \rightarrow 2M + 3SiF_4,$$

where M is selected from the group consisting of tungsten and molybdenum.

15. The method of claim 14 wherein said metal is tungsten.

16. The method of claim 14 wherein said metal is molybdenum.

17. The method of claim 12 wherein said solution is KOH.

18. The method of claim 5 further comprising the step of:

(f) depositing a refractory metal onto the etched back surface of the substrate according to the reaction:

$$MF_6 + 3H_2 \rightarrow M + 6HF.$$

19. The method of claim 14 further comprising the step of:

(d) depositing a refractory metal onto the etched front of the substrate according to the reaction:

$$MF_6 + 3H_2 \rightarrow M + 6HF.$$

* * * * *